United States Patent [19]

Boivin

[11] Patent Number: 5,237,282
[45] Date of Patent: Aug. 17, 1993

[54] COMPUTER CONTROLLED MEASUREMENT AND SWITCHING CIRCUIT FOR CABLE TESTING

[75] Inventor: Nicole L. Boivin, Gloucester, Canada

[73] Assignee: Her Majesty the Queen in right of Canada, as represented by the Minister of National Defence of Her Majesty's Canadian Government, Ottawa, Canada

[21] Appl. No.: 691,384

[22] Filed: Apr. 25, 1991

[30] Foreign Application Priority Data

Apr. 30, 1990 [CA] Canada .................... 2015724

[51] Int. Cl.$^5$ ............................ G01R 31/02
[52] U.S. Cl. ........................ 324/539; 324/66
[58] Field of Search ................. 324/539–542, 324/66

[56] References Cited

U.S. PATENT DOCUMENTS

| | | | |
|---|---|---|---|
| 2,962,659 | 11/1960 | Neill | 324/540 |
| 3,430,135 | 2/1969 | Mullen | 324/540 |
| 3,678,379 | 7/1972 | Arvay et al. | 324/539 |
| 4,901,003 | 2/1990 | Clegg | 324/539 X |

*Primary Examiner*—Walter E. Snow
*Assistant Examiner*—Glenn W. Brown
*Attorney, Agent, or Firm*—Larson & Taylor

[57] ABSTRACT

A control circuit for a cable tester having a computer interface and a cable adaptor. The latter comprises a current source having inputs from the computer interface and outputs to a first group of solid state switches having inputs from the current source and the computer interface and having outputs to an input of the cable adapter; a second group of solid state switches having inputs from the first group of solid state switches and the computer interface and having outputs to a first amplifier; and a third group of solid state switches having inputs from a fourth group of solid state switches and the computer interface and having outputs to the first amplifier. The fourth group of switches has inputs from an output of the cable adapter and the computer interface and has an output to ground, and the first amplifier has an output to the computer interface. When a cable having a conductor therein is connected to the cable adaptor, the computer interface is operative to selectively activate the current source and close each of the related switches in the first, second, third and fourth groups of solid state switches thereby causing a current to flow through a selected conductor in the cable under test and hence providing the computer interface with an output from the first amplifier.

20 Claims, 16 Drawing Sheets

COMPUTER CONTROLLED MEASUREMENT AND SWITCHING CIRCUIT FOR CABLE TESTING

FIELD OF THE INVENTION

The present invention relates to a control circuit for use in a tester that tests the continuity and short circuit properties of a cable, a harness or the like.

BACKGROUND OF THE INVENTION

A requirement has long existed in industry to test multiple conductor cables and harnesses for functionality. Three basic electrical tests are conducted routinely, the continuity test, the short circuit test and the insulation test. The insulation test is normally conducted by the manufacturer of the Cable.

Relatively simple cables may be manually tested using an ohmmeter to measure circuit path resistance. However this technique is not practical with cables having a large number of conductors. Since any conductor could short to any other conductor in a cable, the number of potential shorted paths in a cable with n conductors approaches $((n*(n-1))/2) - n$. For a 100 conductor cable a complete check for short circuits approaches 4,850 tests and hence it is not practical to manually perform the test.

Presently known Cable Testers automatically test cables and harness assemblies. A typical cable testing system employs some means for mating the connectors of the cable to the inputs and outputs of the test equipment. Within the test equipment, two groups of switches connect a conductor at each end of the circuit path under test to a resistance measurement circuit. The resistance measured is compared to the expected resistance for that path to determine a pass/fail condition.

A limitation in the currently known Cable Testing Systems is that they use relay switches to perform the switching function. Relays are expensive, bulky and slow. Since a large number of switch contacts are needed (200 for the example above with a 100 conductor straight through cable) a relay switching implementation would cost thousands of dollars and would be of considerable size and weight. The inherent unreliability of an electromechanical device and the slowness of the relay also cause a delay in the switching function. Upon activation or deactivation of the switches the switch contacts of a relay may bounce. A reliable switch open or closed state will not occur for between 50-150 mSec after relay activation. This limits the rate at which circuits may be tested at a rate of approximately 10 circuits per second.

SUMMARY OF THE INVENTION

The control circuit of the present invention can be used in any Cable Testing System having a computer interface. The control circuit of the present invention enables the Cable Testing System to test approximately 400 circuits per second, to measure the path resistance accurately to $+/-0.005$ ohms and to identify the faulty circuit path in the cable.

The present invention utilizes a solid state switch integrated circuit to perform the switching function in place of relays. These standard integrated circuits are small, inexpensive and fast switching thereby providing a more efficient switching function. These switches have not been used before to perform the switching function since their switch resistance is unpredictable. The control circuit disclosed herein eliminates the property of unpredictable resistance of the solid state switches upon the measurement of the path resistance through the cable circuit.

Accordingly the present invention relates to a control circuit for a cable tester having a computer interface and a cable adaptor, said control circuit comprising; a current source having inputs from the computer interface and outputs to a first group of solid state switches; the first group of solid state switches having inputs from the current source and the computer interface and having outputs to an input of the cable adapter; a second group of solid state switches having inputs from said first group of solid state switches and the computer interface and having outputs to a first amplifier means; a third group of solid state switches having inputs from a fourth group of solid state switches and the computer interface and having outputs to the first amplifier means; and the fourth group of switches having inputs from an output of the cable adapter and the computer interface and having an output to ground; and the first amplifier means having an output to the computer interface; whereby when a cable having at least one conductor therein is connected to the cable adaptor the computer interface is operative to selectively activate the current source and close each of the related switches in the first, second, third and fourth groups of solid state switches thereby causing a current to flow through a predetermined conductor in the cable under test and hence providing the computer interface with an output from said first amplifier means.

BRIEF DESCRIPTION OF THE DRAWINGS

The present invention will be more fully appreciated from the following detailed description when the same is considered in connection with the accompanying drawings, in which.

DESCRIPTION OF THE PREFERRED EMBODIMENTS

Figure 1:
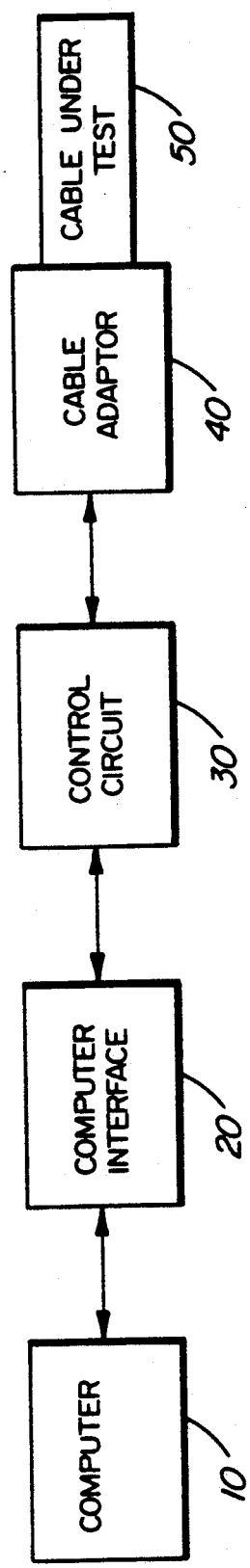
FIG. 1 shows a block diagram of a cable tester according to the present invention.
Figure 11A:
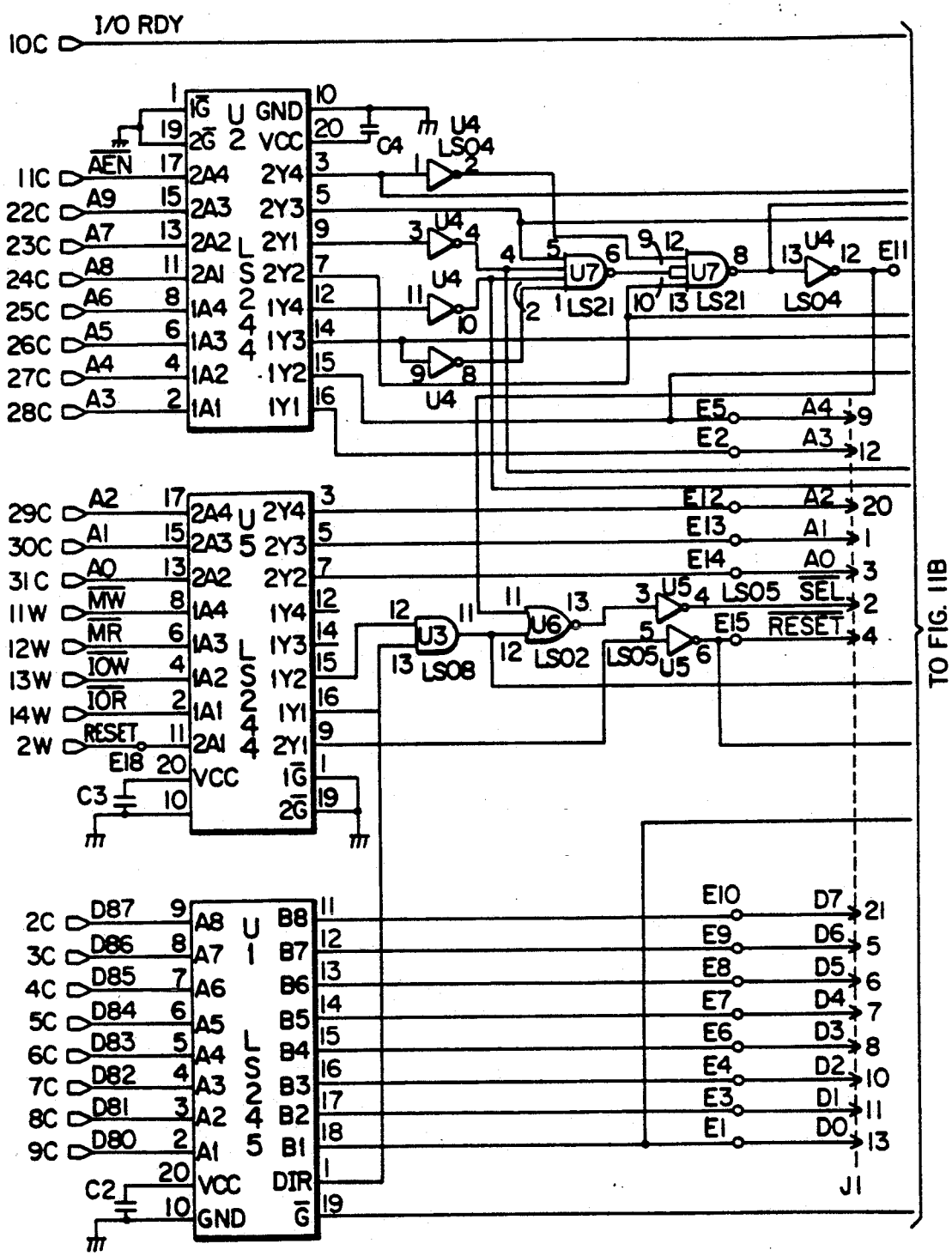
FIGS. 11A and 11B are a schematic drawing to show details of the computer interface envisaged in accordance with the present invention.
Figure 11B:
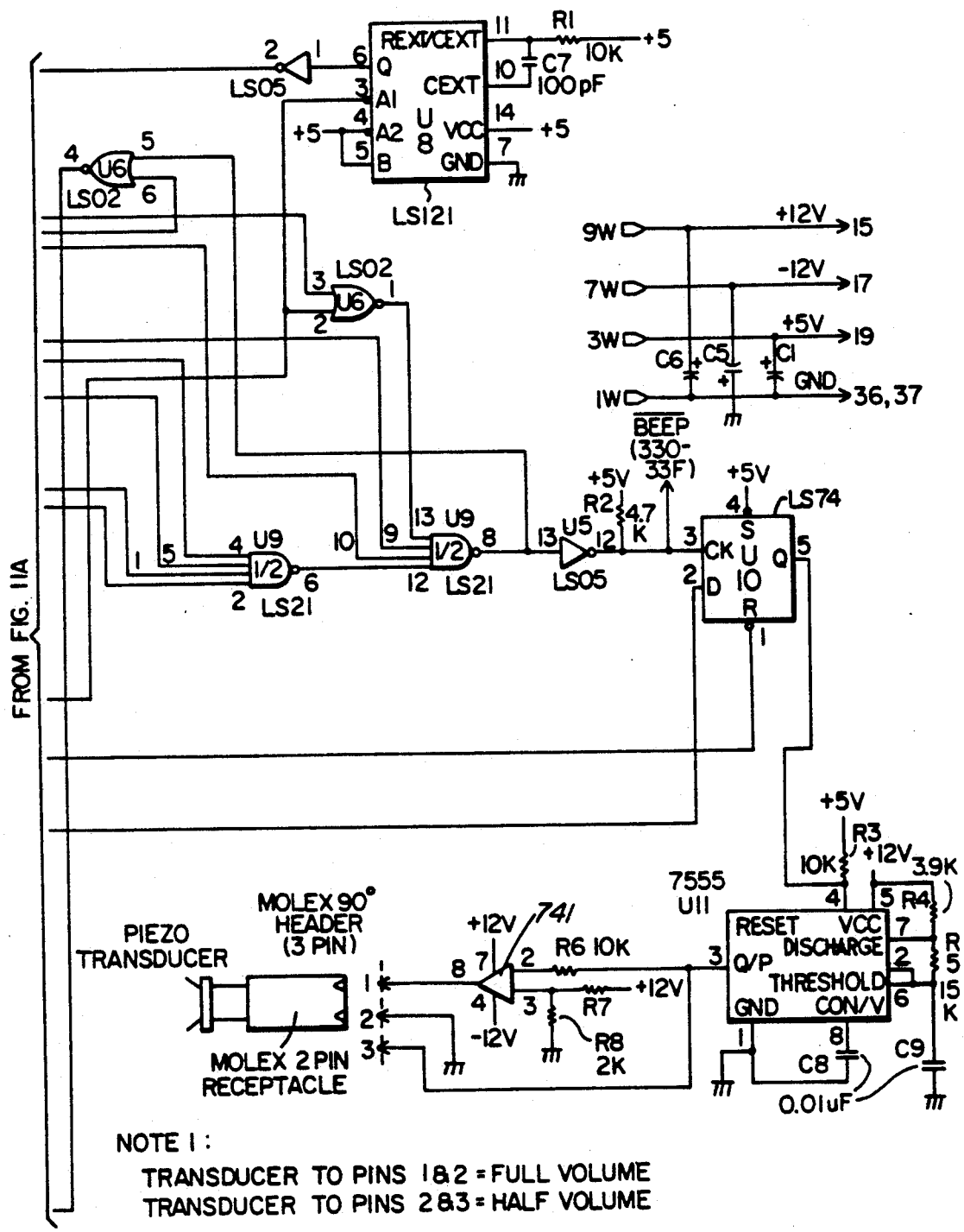

Referring now to FIG. 1 which shows a block diagram of a cable tester of the present invention. The cable tester is comprised of a computer 10, a computer interface 20, a control circuit 30, and a cable adaptor 40. The computer 10 is interconnected with the computer interface 20 whose detail is shown in FIG. 11. The control circuit 30 is interconnected with the computer interface 20 and is also interconnected with the cable adapter 40. A cable under test (the load) 50 is connected to the cable adapter 40.

When the cable under test 50 is connected to the cable adaptor 40 and the computer 10 under software control, sends a command to the computer interface 20 to test the cable 50 then the computer interface 20 activates the control circuit 30. In return the computer interface 20 receives a value from the control circuit 30 and supplies it to the computer 10.

Any configuration of a computer interface 20 may be used but it must be capable of providing and receiving information in both the computer 10 readable form and in the control circuit 30 readable form.

Figure 2:
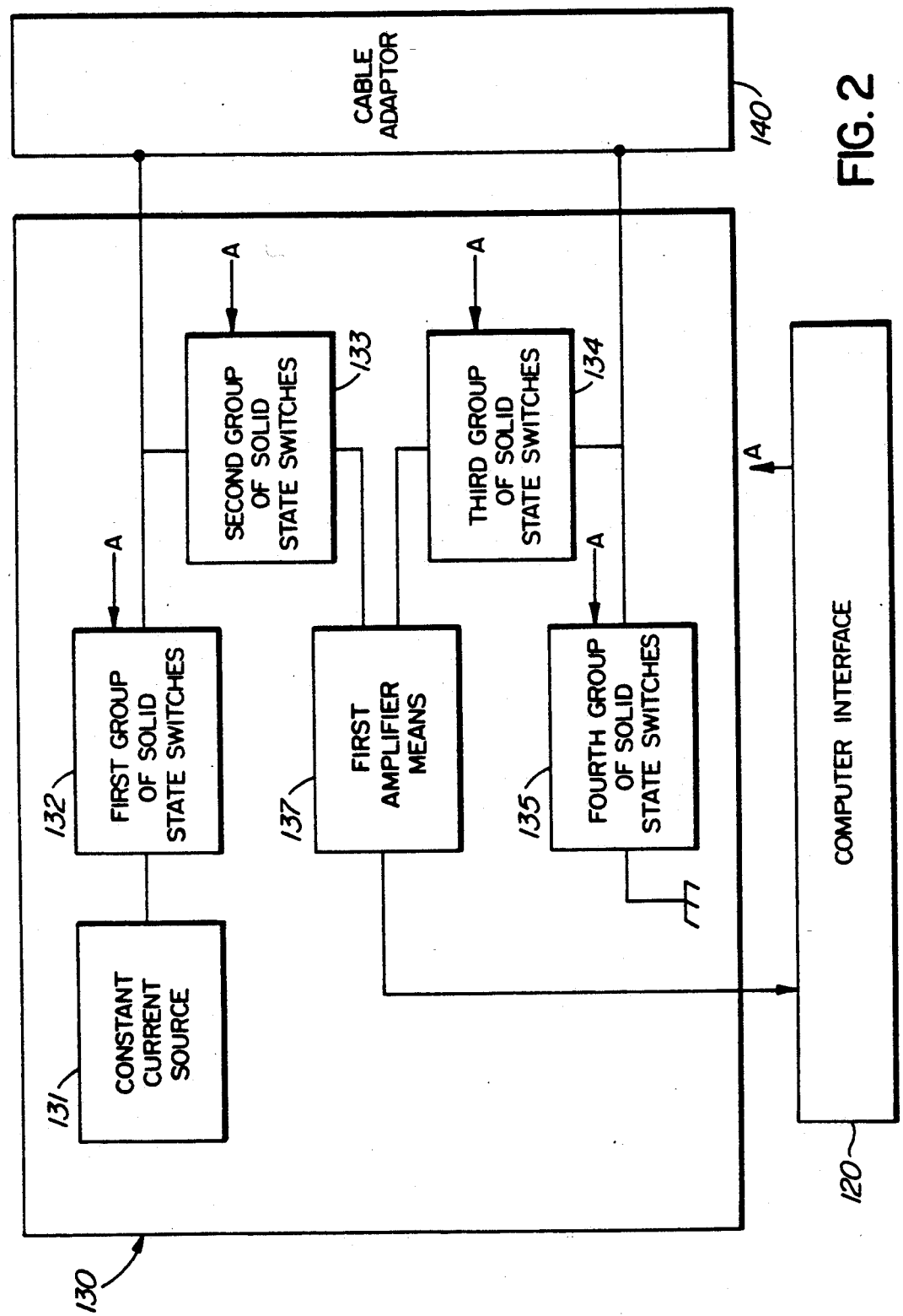
FIG. 2 illustrates one embodiment of the invention as used for continuity testing.

Let us refer now to FIG. 2 which illustrates one embodiment of a control circuit 130 of the present invention by which a continuity test is performed by measuring the resistance of the load. The control circuit 130 is comprised of a constant current source 131 shown also in FIG. 12, a first, second, third and fourth group of solid state switches 132, 133, 134, and 135 respectively, and a first amplifier means 137 whose detail is seen in the upper part of FIG. 12. Each group of switches is comprised of n switches. The reader is referred to FIGS. 13A and 13B for a schematic showing such switches in complementary pairs. The constant current source 131 is connected to an input of the first group of switches 132. The output of the first group of switches 132 is connected to the output of the cable adaptor 140. The input of the cable adaptor 140 is connected to the input of the fourth group of switches 135. The fourth group of switches 135 is also connected to ground. The second group of switches 133 has an input from the first group of switches 132 and an output to the first amplifier means 137. The third group of switches 134 has an input from the fourth group of switches 135 and an output to the first amplifier means 137. See FIGS. 13A and 13B. The output of the first amplifier means is provided to an input of the computer interface 120. The computer interface 120 provides an address to each of the first, second, third and fourth group of switches 132, 133, 134, and 135 respectively.

The computer interface 120 selectively closes a selected switch in each of the groups of switches by providing an address of a switch to be closed to each of the groups of switches 132, 133, 134 and 135. See FIG. 12 for the circuitry that provides the addressing and measurement functions. Since the resistance of the first, second, third and fourth group of switches 132, 133, 134 and 135 respectively is unpredictable the voltage at any point along the path is also unpredictable. However, as the group of switches 132, 133, 134 and 135 introduce less than 40 nanoamps of leakage current, the current will remain virtually constant along the entire path. The resistance of the load, i.e. the conductor within the cable being tested can be measured if the differential voltage between the closed switch in the first group of switches 132 and the closed switch in the fourth group of switches 135 is measured ($R=I/V$). The current (I) is a known value and the differential voltage (V) is measured by the first amplifier means 137. The output of the first amplifier means 137 is provided to the computer interface 120 and can be used by a computer to calculate the resistance of the load.

The first, second, third and fourth groups of solid state switches 132, 133, 134 and 135 respectively are preferably standard switch integrated circuits such as CMOS JFET switch integrated circuits.

Figure 3:
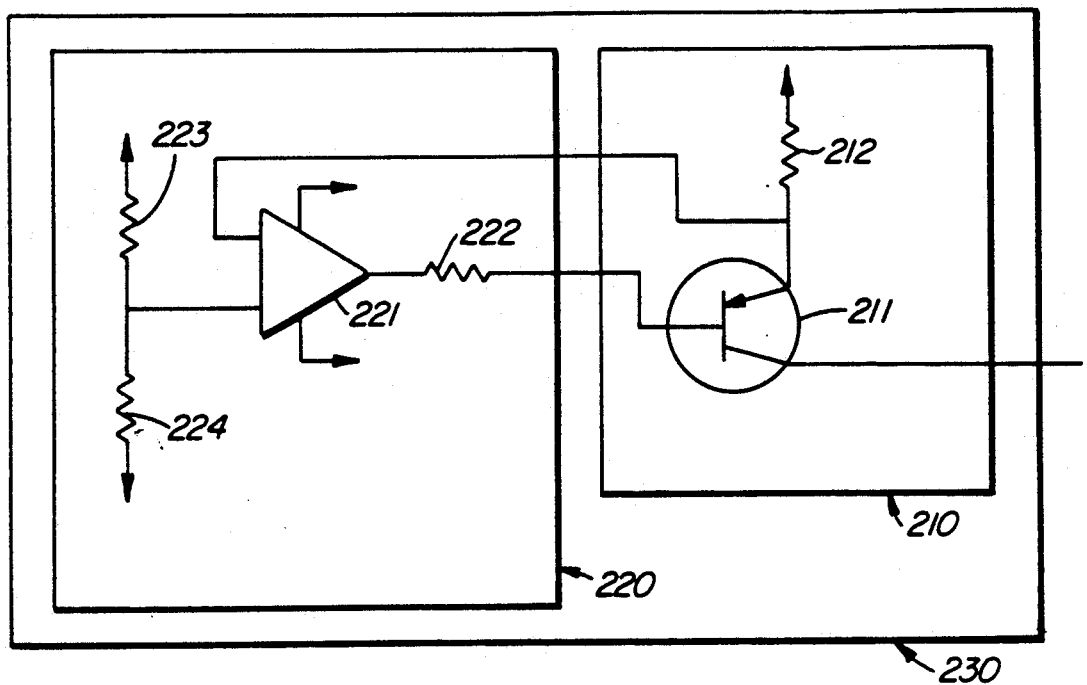
FIG. 3 illustrates a configuration of a constant current source that may be used in the present invention.

Referring now to FIG. 3, there is shown one form of constant current source 230 that may be used in the control circuit of the present invention. The constant current source 230 is comprised of a transistor means 210 connected to an operational amplifier means 220. When a voltage is supplied to the operational amplifier means 220 and to the transistor means 210 a current is supplied through the collector of the transistor 211. One type of an operational amplifier means 220 that may be used comprises an operational amplifier 221 having an input from a voltage source through a series of resistors 223, 224 and an input from the emitter of the transistor 211. The operational amplifier 221 is preferably a type 741 integrated chip. The output of the operational amplifier 221 is connected to the base of the transistor 211 through a resistor 222. The emitter of the transistor 210 is connected to a voltage source through a resistor 212. The current is provided to the control circuit through the collector of the transistor 211. Any other form of known constant current sources may be used to provide a constant current to the control circuit of the present invention.

Figure 4:
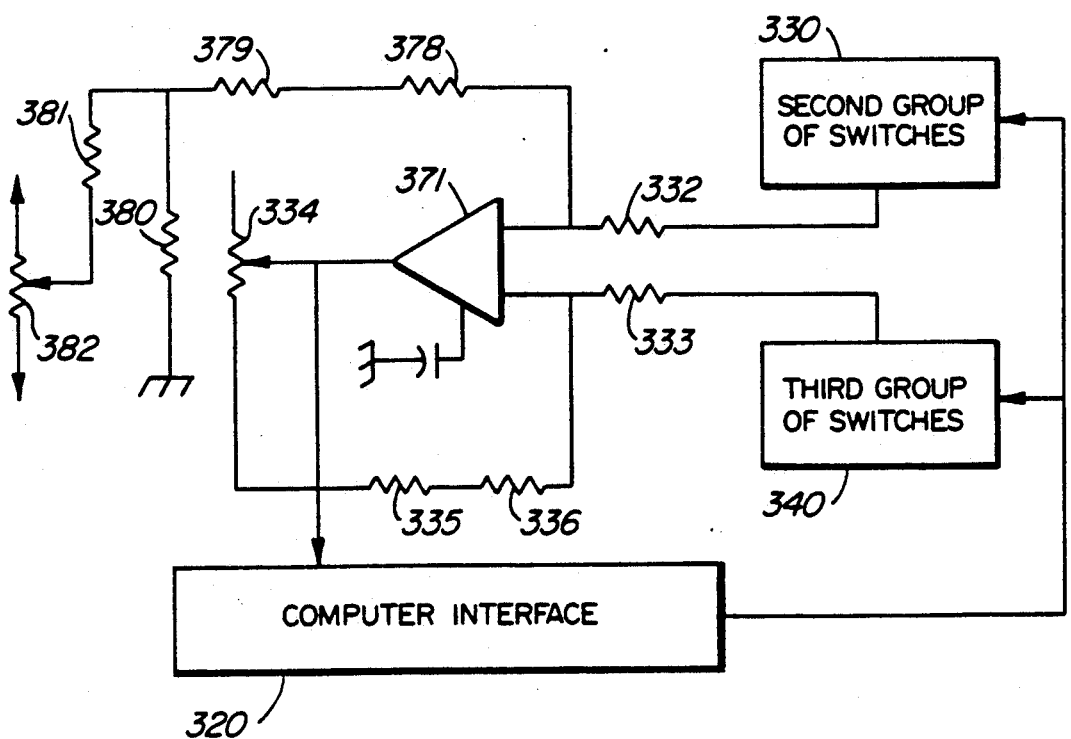
FIG. 4 illustrates a first amplifier means that may be used in the present invention.

Let us now turn to FIG. 4 which illustrates a first differential amplifier means that may be used in the control circuit of the present invention. A differential amplifier 371 has a first input through a first resistor 332 from the second group of switches shown at 330 and a second input through a second resistor 333 from the third group of switches shown here at 340. A means for finely adjusting gain preferably comprises a series of resistors 334, 335, 336, is also connected to the second input of the differential amplifier 371 as shown in FIG. 4. A means for cancelling offset voltages preferably comprising a series of resistors 378, 379, 380, 381, 382 which are connected to the first input of the differential amplifier 371 as shown in FIG. 4. Although a specific configuration of a differential amplifier means has been disclosed, any type of differential amplifier that can supply the computer interface 320 with a measurement value for the voltage drop across the load by measuring the voltage drop between the switch closed in the second group of switches 330 and the switch closed in the third group of switches 340, can be used in the control circuit of the present invention, providing the differential amplifier has a high input resistance relative to the channel resistance of the switches. An operational amplifier chip type "108" may be used in the control circuit as the differential amplifier 371.

Figure 5:
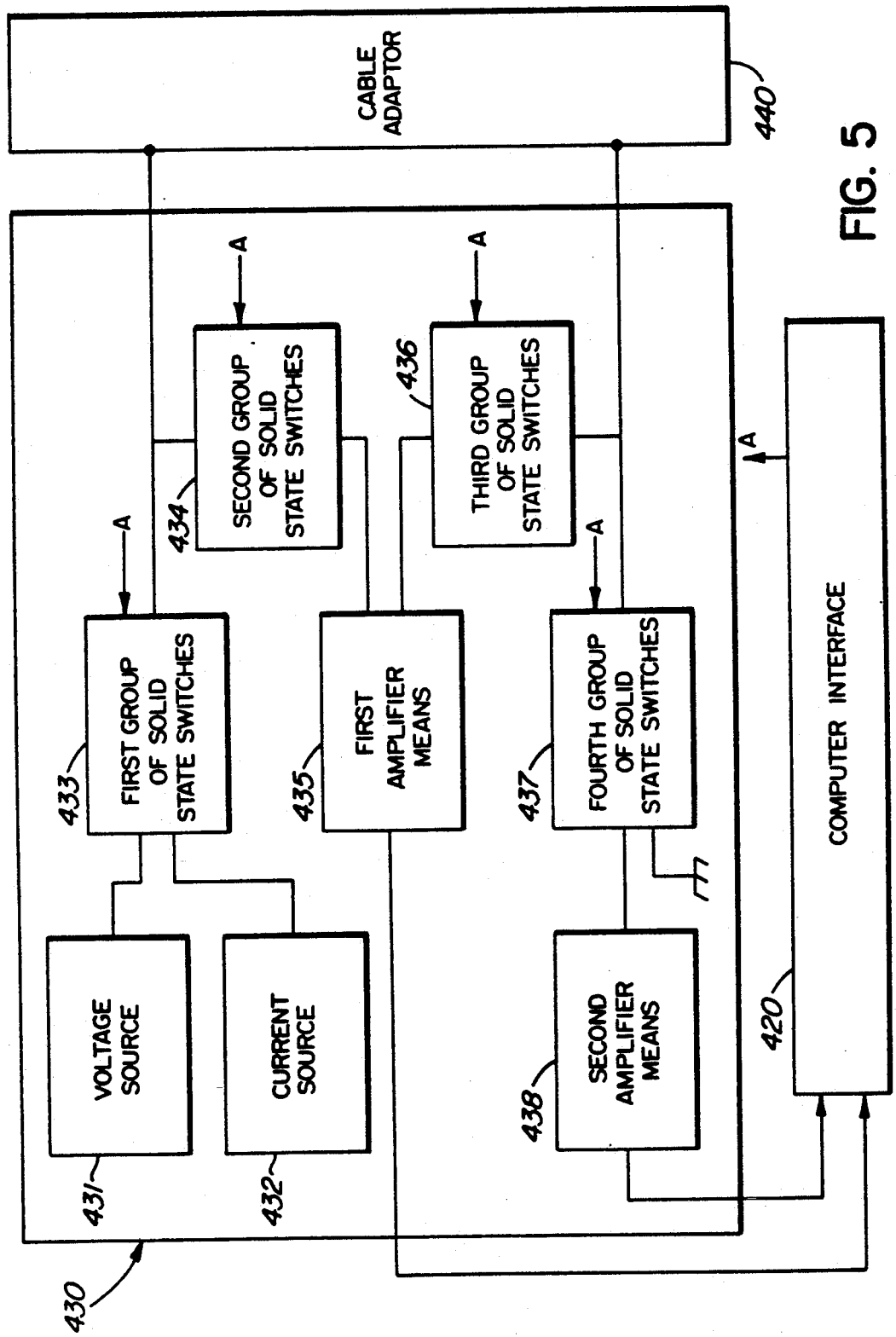
FIG. 5 illustrates another embodiment of the invention as used for short circuit testing.

Referring now to FIG. 5 there is illustrated a second embodiment of the control circuit of the present invention. The control circuit further comprises a voltage source 431 having an output to a first group of switches 433, and a second amplifier means 438 (shown in detail in the upper middle portion of FIG. 11) having an input from the fourth group of switches 437 and an output to the computer interface 420. In this embodiment of the invention the control circuit performs a short circuit test.

When the computer commands the computer interface 420 to perform the short circuit test, the computer interface 420 operates to close a selected switch in each of the first, second, third and fourth groups of switches 433, 434, 436 and 437 respectively. The resistance of the load is then determined by using the output from the second amplifier means 438.

Since the resistance of the load dominates the total path resistance in this embodiment, then the current through the load can be measured. If a current is detected then that would indicate that a short or a partial short exists in one (or more) conducting path in the cable under test, which is identifiable relative to the particular selected switches which had been closed in the first, second, third and fourth groups of switches. Since the value of Voltage (V) and current (I) are known the resistance of the circuit path can now be determined.

The constant current source illustrated in FIG. 3 can be used as a current source and as a voltage source. For any total path resistance (Rtot) from the collector of the transistor 210 for which $Rtot > [(Vin - 0.8)/Iref]$, the constant current source cannot function as such since there is insufficient supply voltage to drive the current through this resistance. Under this condition the transistor 210 behaves as a voltage source providing a constant voltage to the circuit path for the conductor in the cable under test.

Figure 6:
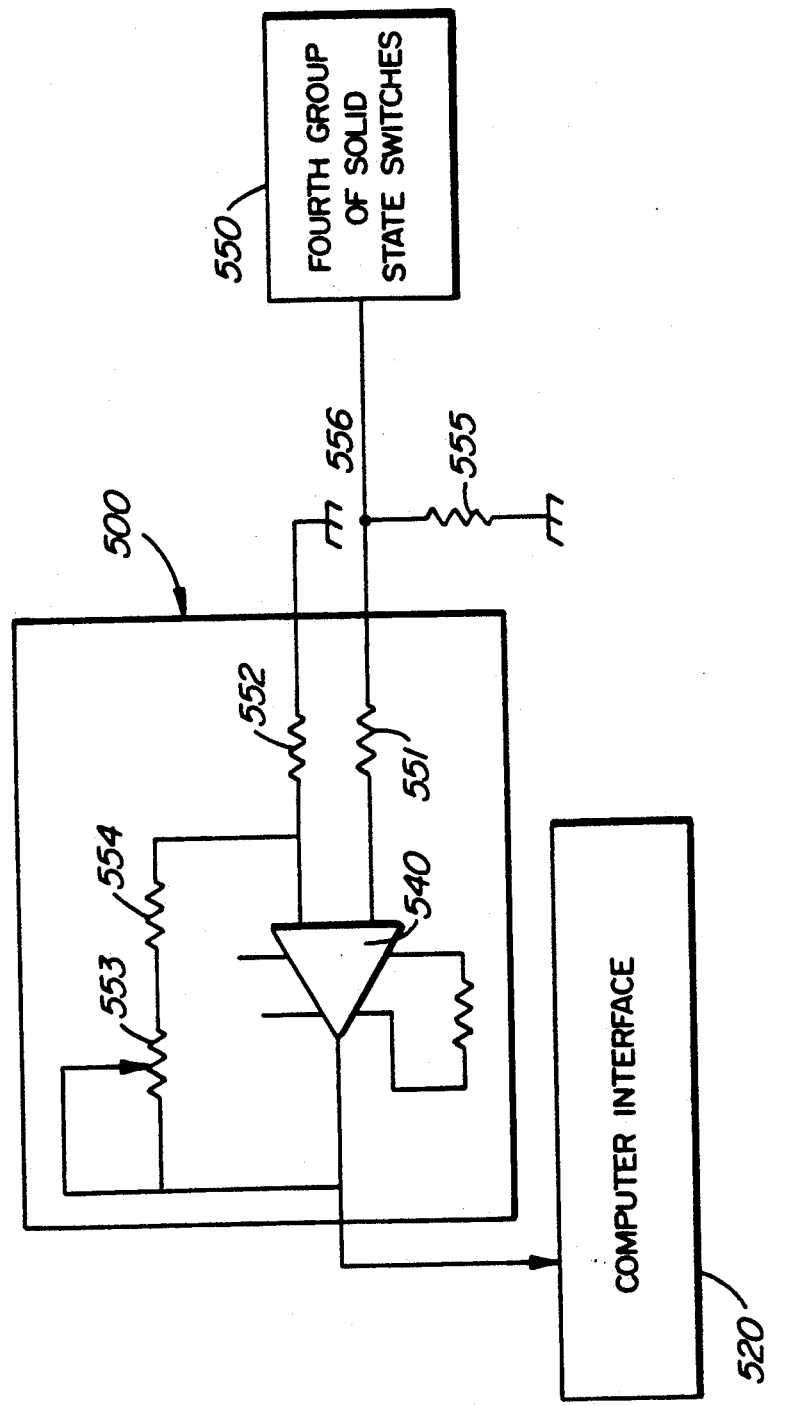
FIG. 6 illustrates a second amplifier means that may be used in the present invention.

Referring now to FIG. 6, a second amplifier means which is illustrated at 500 may be used in the control circuit of the present invention. In this embodiment the output of the fourth group of switches 550 is grounded through a resistor 555. For $R(load) >> $ Value of resistor 555 plus the resistance of the switches 550 together with the resistance of the first group of switches 433, the voltage at point 556 will be proportional to the product of the supply voltage, the value of resistor 555 and the conductance of the load. In the second amplifier means 500, an operational amplifier 540 has a first input from the fourth group of switches 550 through a resistor 551 and a second input from ground through a resistor 552. It is preferable that the value of resistors 551 and 552 be equivalent, and that they have a very high resistance, for example 1 Megohm. The output of the operational amplifier 540 is fedback through a means for finely adjusting the gain, which may be comprised of a series of resistors 553 and 554, as is shown in FIG. 6, and is also provided to a computer interface 520. The operational amplifier 550 may be a 741 integrated chip or a OP07. Although a specific configuration for the second amplifier means 500 has been described, any operational amplifier means may be used in the control circuit of the present invention.

Figure 12A:
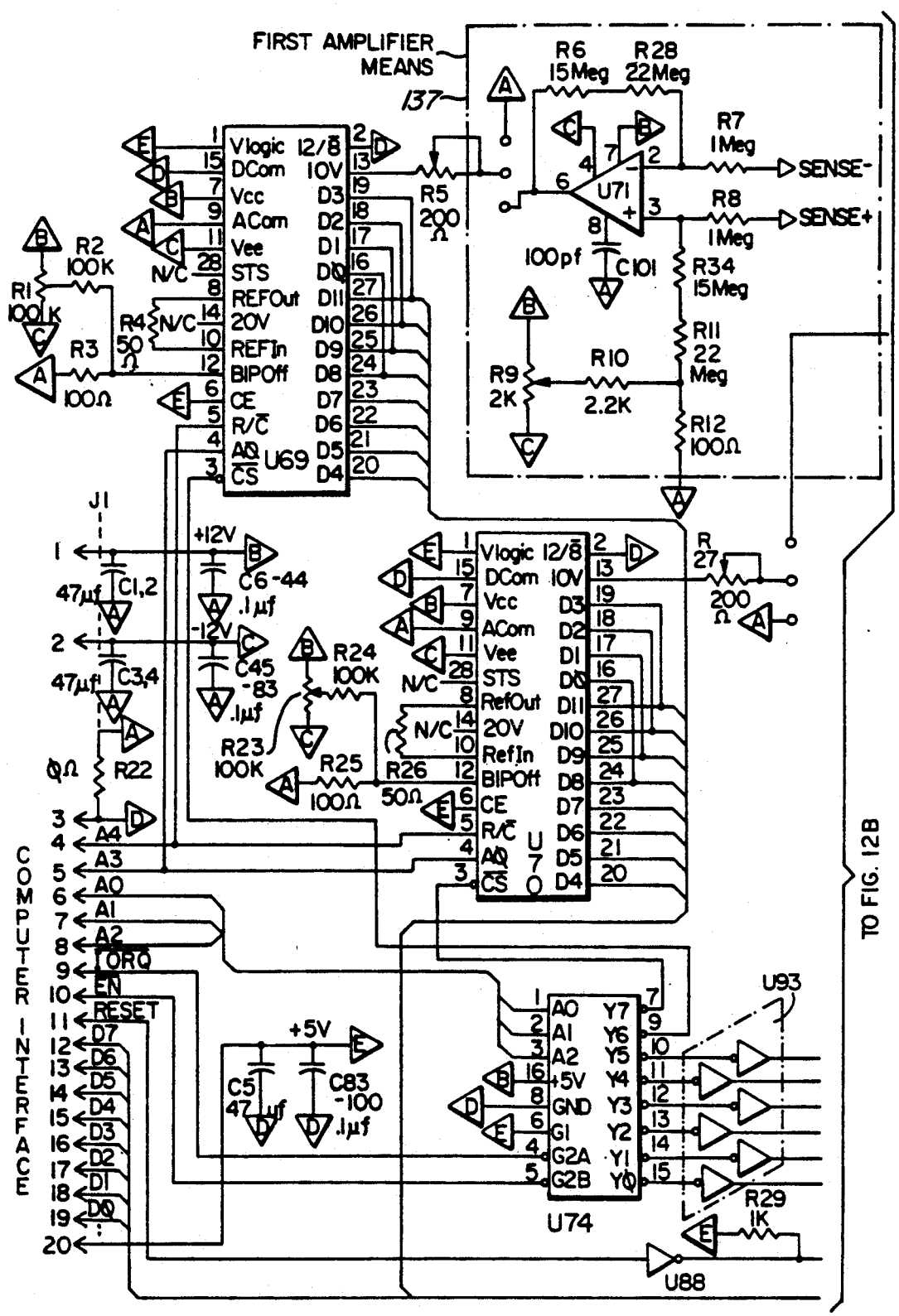
FIGS. 12A, 12B, and 12C are also a schematic drawing to show details of the circuitry which accomplishes addressing and measurement functions in the control circuit of this invention, and indicated overall in FIG. 2.
Figure 12B:
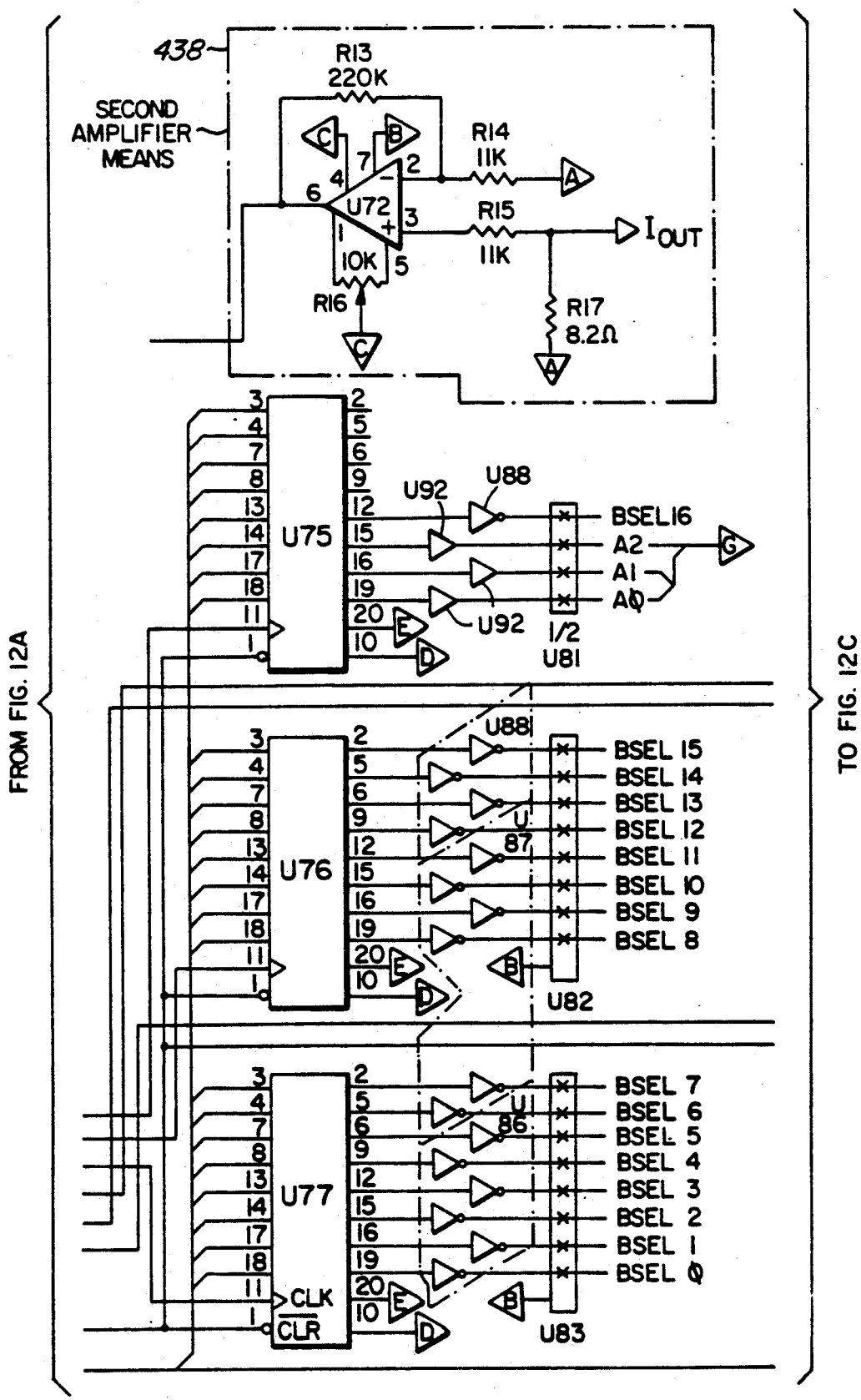
Figure 12C:
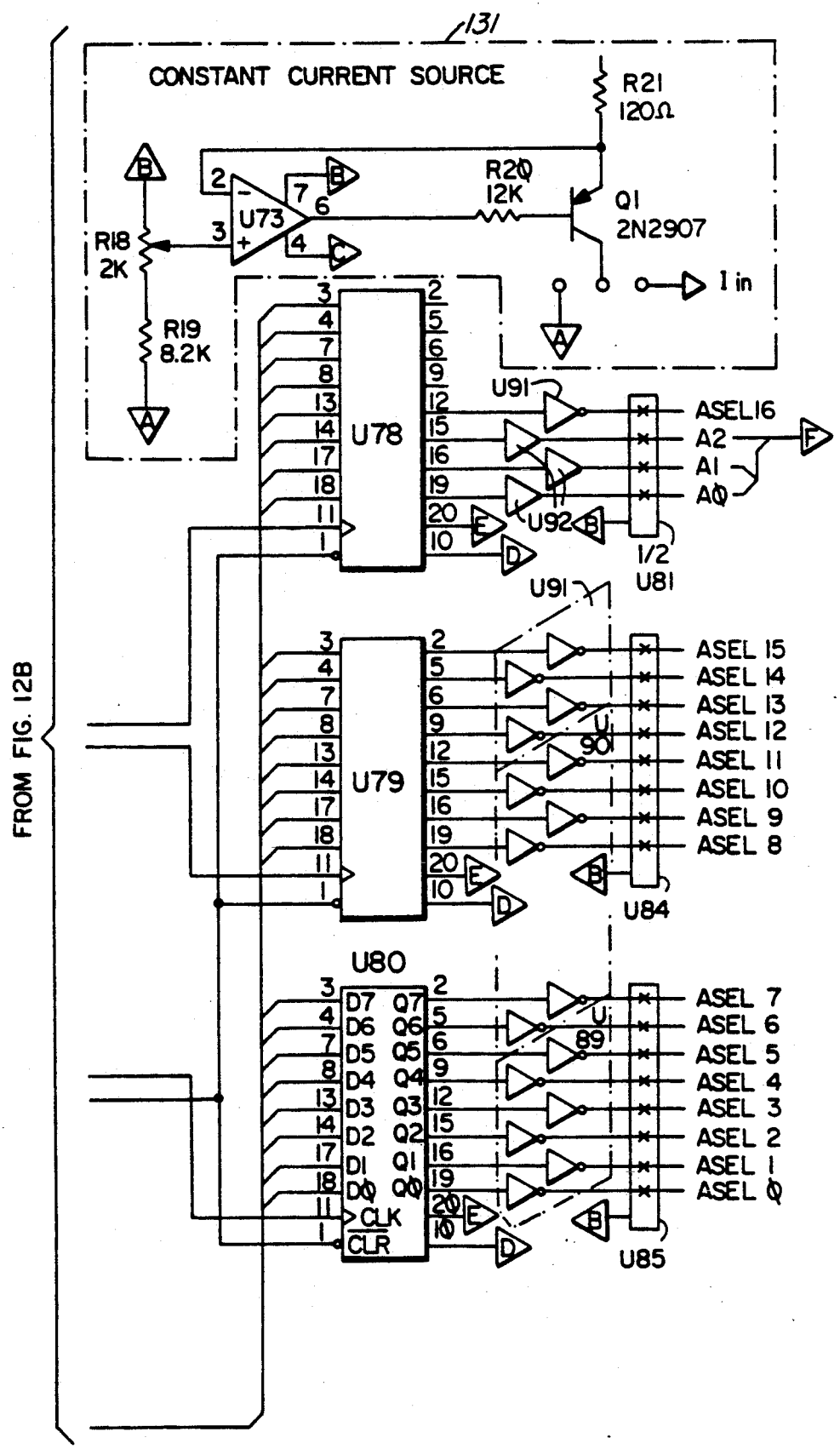

The computer interface 520 must be capable of providing an address to each of the groups of switches of the control circuit of this invention, of converting the output of the first differential amplifier means into a computer readable form, and also converting the output of the computer into a form receivable by the control circuit. Thus when the computer issues a command to perform the continuity test on a certain conductor of a multi-conductor cable, the computer interface must be capable of providing an address to each selectable switch of the groups of switches of the control circuit, of connecting the current source to the selected one of the first group of switches and then reading the resulting output from the first amplifier means. The computer interface must also be capable of converting analog output of the first amplifier means to a computer readable form and supplying the value to the computer. FIG. 12 shows schematically the circuitry involved.

Similarly, when the computer issues a command to perform a short circuit test on certain conductors of a multiconductor certain cable, the computer interface must again be capable of providing an address to each selectable switch of the groups of switches, and reading the output of the second amplifier means. The computer interface must be capable of converting the output of the second amplifier means to a computer readable form and supplying the output value to the computer.

Since it is possible to test for short circuits to multiple conductors at the same time a plurality of related switches may be closed at the same time so that a batch of conductors can be tested. If it is found that a certain batch of conductors contains a defective conductor then each conductor in that batch is tested individually. This method of testing for short circuits decreases the time needed to perform the short circuit test.

Figure 7:
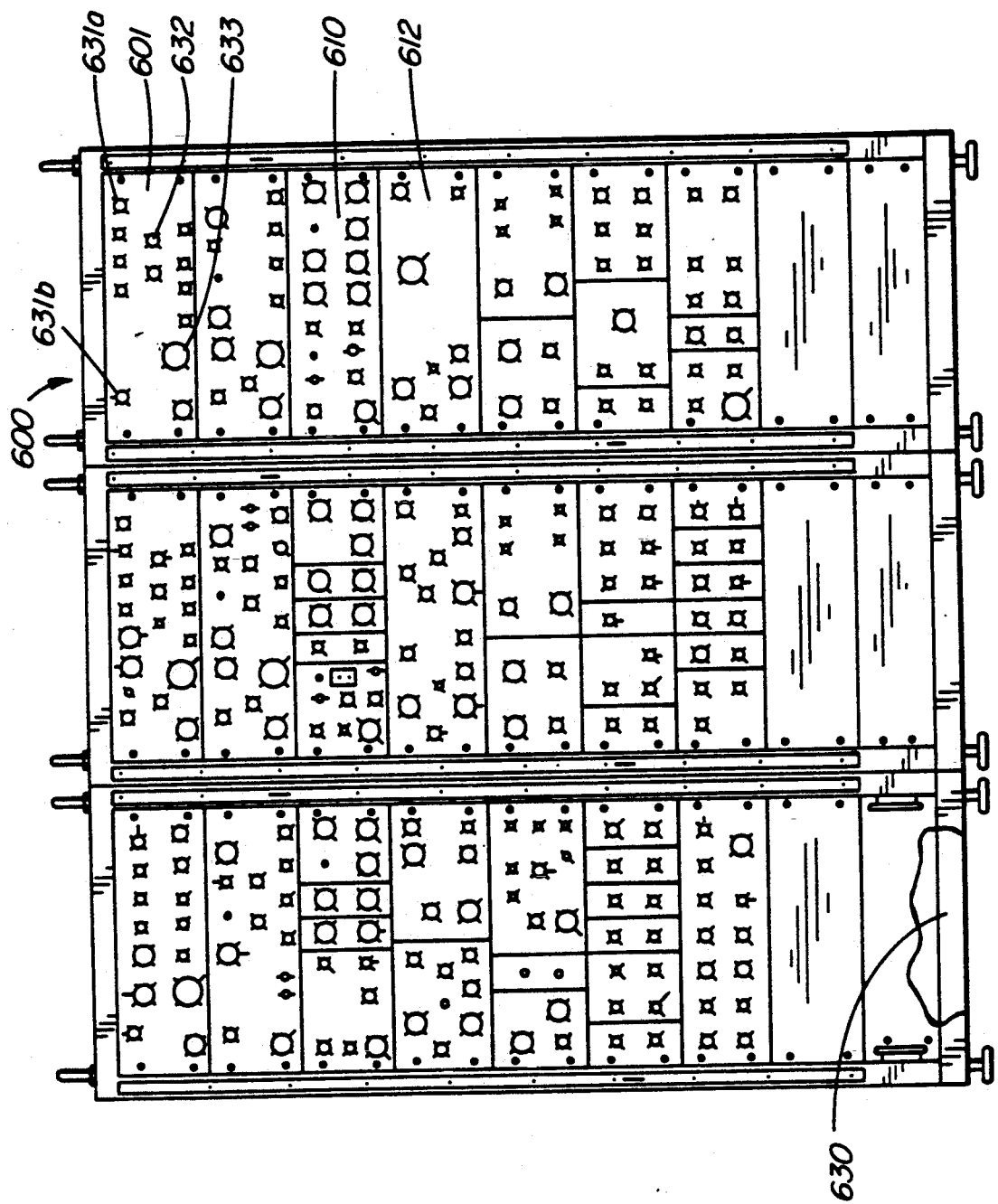
FIG. 7 illustrates a typical cable adapter that may be used in the present invention.

Referring now to FIG. 7, a cable adapter is shown overall at 600. This cable adaptor 600 is comprised of a series of fixture panels such as that shown at 601, 610 and 612. In the face of each fixture panel 601 etc., is a multiplicity of individually configured sockets as illustrated at 631, 632 and 633. Each end of a cable to be tested is typically provided with a connector of a known configuration, which will be connected, i.e. plugged into a corresponding mating socket in one of the fixture panels 601, 610 and 612.

Figure 9:
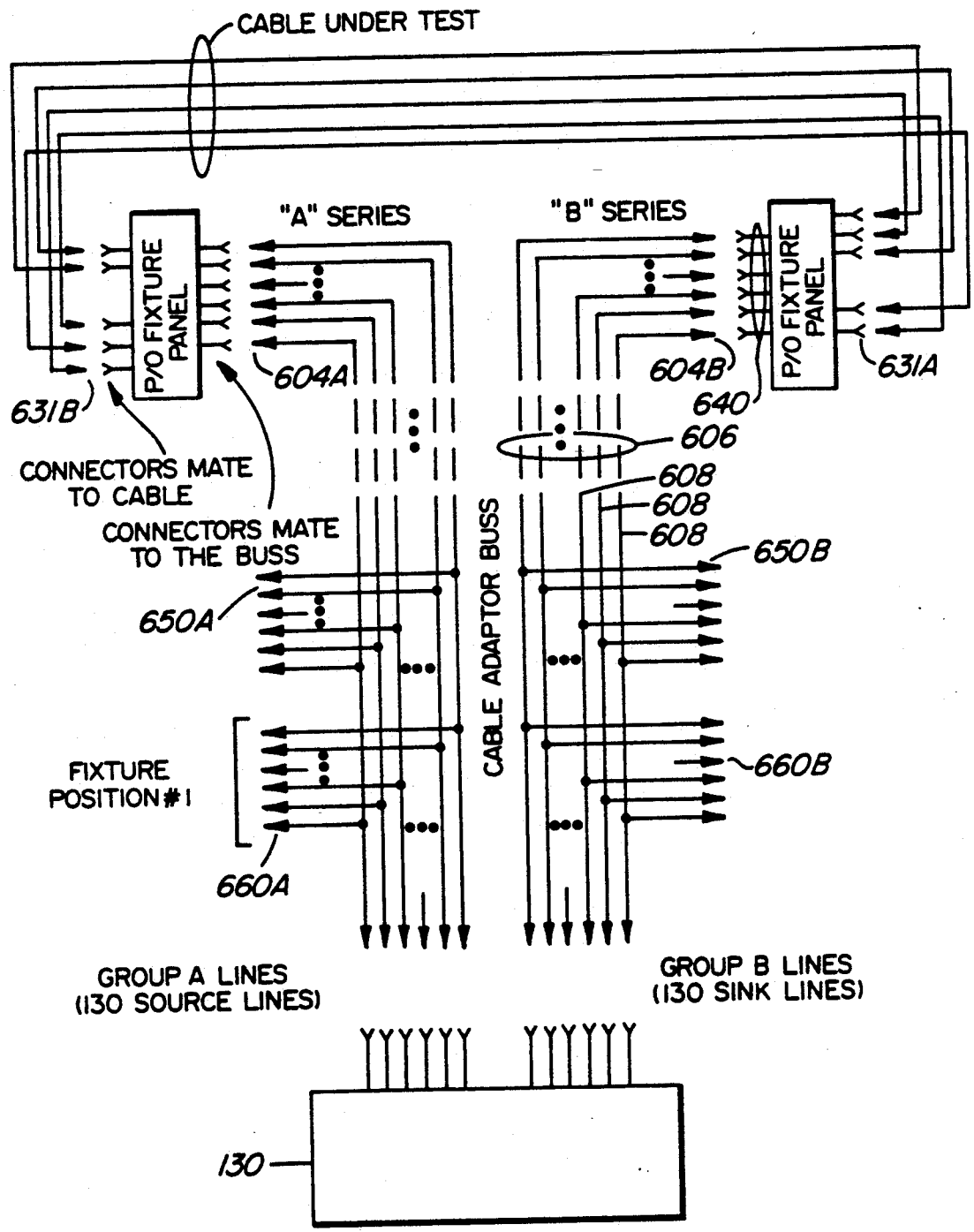
FIG. 9 is a schematic drawing illustrating a common buss configuration as may be used in the cable adapter described herein.

Each of the multiplicity of sockets 631, 632, 633 etc. is connected to a bussing system as shown schematically in FIG. 9. This bussing system is used to connect each of the sockets 631, 632, 633 etc. to a control circuit such as that shown at 130 in FIG. 2. The control circuit 130 is conveniently housed in the lowest part of the cabinet of the cable adaptor 600, as shown at 630.

Referring more specifically to FIGS. 8a to 8d and FIG. 9, a multi-conductor cable to be tested is connected at each end thereof to corresponding mating sockets 631a and b, (FIG. 9), for instance, mounted in the face of a fixture panel shown at 601. The associated sockets 631a and b are each connected via a multi-conductor cable schematically shown at 640 to connectors illustrated at 604(A) and 604(B), which form part of the common bussing system. Here, each of the connectors shown at 604(A) and 604(B) actually comprises a set of three cables indicated collectively at 606, and each of which itself comprises fifty conductors 608. Thus, the connectors 604(A) and 604(B) represent three separate connectors and related cables, to provide the ability to test up to 130 conductors in a given cable undergoing testing. The connectors 604(A) and 604(B) are connected via the cables 606 and individual conductors 608 to input connections, for example, of the control circuit 130 shown in FIG. 2. The cable 606 may be a bundle of conductors, or a multi-conductor ribbon cable as is known in the art. As noted earlier, the control circuit 130 is located for convenience within the bottom portion of the cable adaptor 600, as shown in FIG. 7 at 630.

FIG. 9 shows other related pairs of connections at 650(A) and 650(B) and 660(A) and 660(B). These related pairs of connections are connected by multi-conductor cables such as that shown at 640, to other individually configured sockets in other fixture panels such as those shown at 610 and 612 in FIG. 7.

Figure 8A:
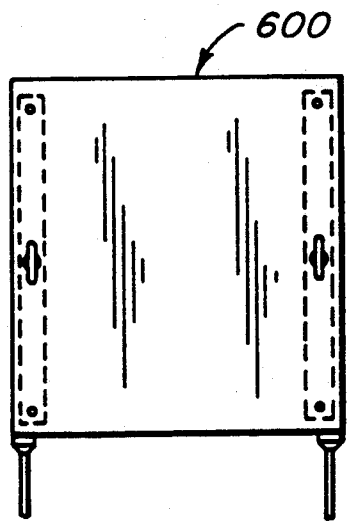
FIG. 8a, 8b, 8c and 8d are, respectively, top, bottom, back and side elevation views of the cable adapter of FIG. 7.
Figure 8B:
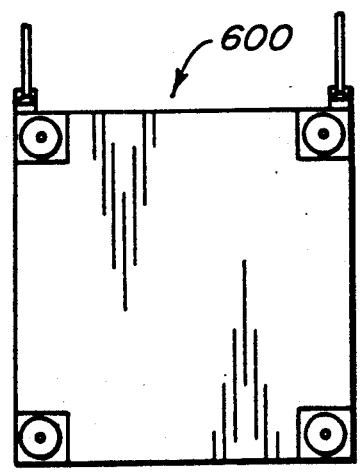
Figure 8C:
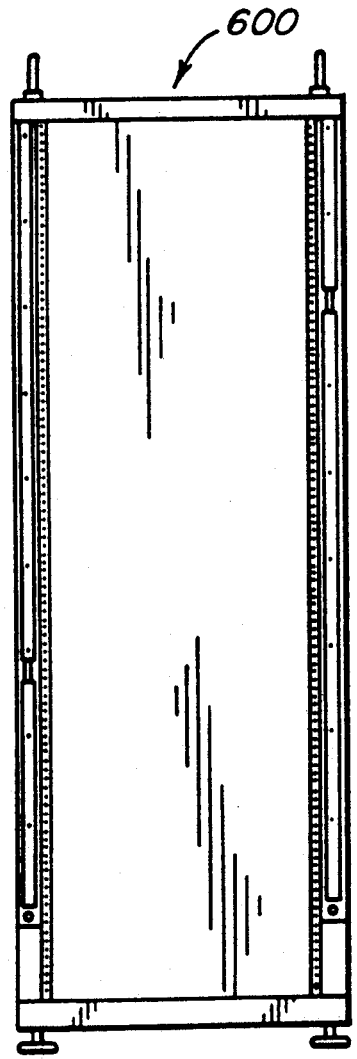
Figure 8D:
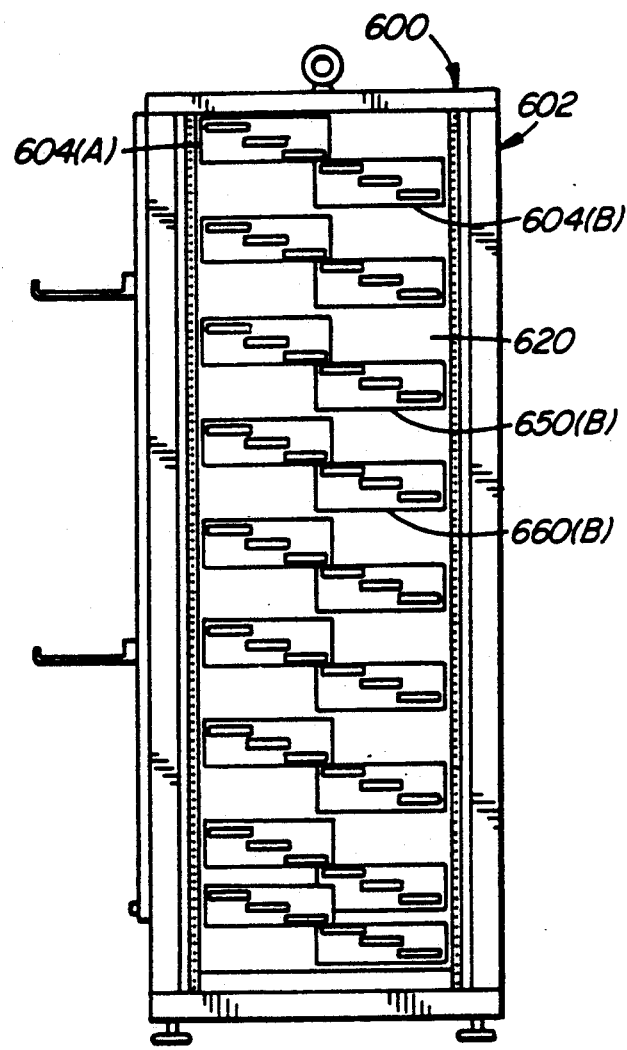

The connectors 604(A) and 604(B), 650(A) and 650(B) etc., are mounted on a panel 620 shown in FIG. 8d, located within the cabinet which represents the cable adapter 600. During assembly, the common bussing system is mounted on the panel 620, from which a free end of multi-conductor cables will hang free, to be connected to the connectors associated with the cabling which connects to each connection pin on each socket carried on a single fixture panel.

An advantage of a cable adaptor according to this invention is that a cable having any type of end connector can be connected to the cable adaptor 600 if a corresponding socket is added to a fixture panel of the cable adaptor, and the address of the pin connections of the new socket are provided to the computer. Thus, when a multi-conductor cable is connected to the cable adaptor 600 and the computer issues a command to test a selected conductor in the cable, the correct conductor is tested since the computer knows by preprogramming the addresses of the connections for each pin of the socket. Another advantage of this type of cable adaptor is that all of the sockets (631, 632, 633) are available to the control circuit at 630 at all times, because of the common bussing system. Also because of the bussing system, more than one type of cable may be connected simultaneously for sequential testing.

The Multiple Sink Mode for Short Circuit Testing

Figure 10:
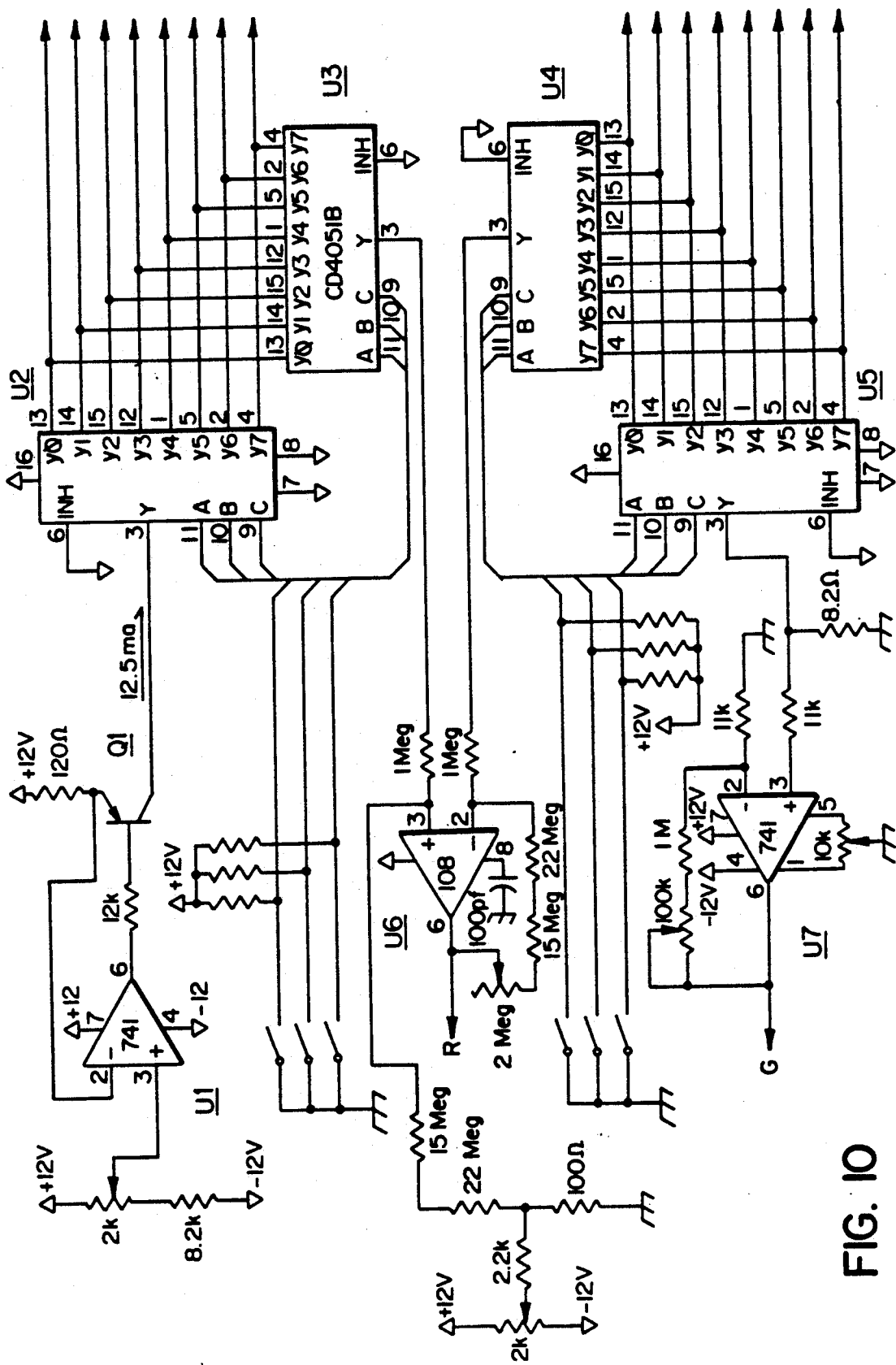
FIG. 10 is a circuit diagram illustrating schematically the analogue switching and measurement portion of the invention shown in block diagrams in FIG. 5.

Referring now to the accompanying drawing FIG. 10, this is a drawing showing a 16 switch implementation. Integrated circuits U2, U3 each contain eight switches and as previously discussed constitute eight current source switches. Within each analogue switch chip, one of the eight switches is selected by means of a 3 bit address on inputs A, B, and C. As the switch pair U2, U3 share a common address they are synchronized. The inhibit pin may be used to prevent any switch from closing. The same holds true for the sink pair U4, U5.

In the actual embodiment of the system there are 17 such source pairs and 17 such sink pairs. Six switches from each source and sink group are reserved for other uses leaving 130 points each for source and sink. All source pairs share a common 3 bit address, however, each pair has a unique inhibit line under computer control. Hence there are 17 inhibit lines for source pairs. The same holds true for the 17 sink pairs. Hence, any one of the 130 source and any one of 130 sink lines may be activated by the computer to test a specific circuit path.

With this invention it is possible to test for short circuits to multiple lines at the same time. Assume that we are testing for shorts to a specific line connected to a source switch. We will select that source switch. However, we can enable a multiplicity of sink switches by enabling more than one sink pair. Of necessity they must share a common 3 bit address. Let us say that there should be no connection from our source switch through the cable to any of these sink switches. Then, given that there is no current path to any of these sink switches, no current will flow through the measurement resistor (8.2 ohms) associated with U7.

Should a current path exist to any of these switches we will measure current. At this point we cannot identify to which line we have a short, so we would have to test each sink connection in the group (up to 17 of them) individually. However for each source connection we can check for shorts against all 130 sink connections in just 8 passes, one pass for each 3 bit address by using a set of 17 bit "address vectors". Should a connection normally exist to a switch within this address vector, we must leave the switch pair disabled (inhibited) or it will interfere with the short circuit measurement. This is done by the software.

Note that this has one further ramification. From previous discussions it was indicated that for an n line cable, the number of potential shorted paths approaches $(n*(n-1)/2)-n$. If testing for shorts on a line to line basis, the amount of time t required to test is exponentially related to n, thus t is proportional to $n \wedge 2$. With this new strategy, however, there are exactly 8 tests per line. The number of tests approaches $8*(n/2)$ which is a linear relationship between n and t.

The Fixturing System/Cable Adaptor

The cable adaptor associated with the cable test controller is implemented as a series of rack cabinets each holding a multiplicity of sockets. One cabinet houses the switching/measuring unit. Each cabinet houses a bus carrying all 260 points of connection. Within each cabinet each socket connects onto the bus using standard connectors. Up to four cabinets may be bolted together and their busses chained together back to the controller. The controller connects to the computer using a single multiconductor cable. This system has the following advantages:

- it is extremely compact. The current system accommodates 75 different complex harness and cable assemblies in 60"×24" of floor space;
- all fixtures are available at all times due to the bus concept. Also due to the bus concept, more than one type of cable (sharing the same fixture panel) may be tested simultaneously in a batch test mode;
- the entire test context may be changed instantly by replacing the rack cabinet system with another. Only one cable from the computer needs to be disconnected and the same computer may test an entire new cable environment immediately;
- an entire cabinet of sockets may be removed or added in less than 30 minutes. Any given panel of sockets may be removed or replaced within 3 minutes;
- new sockets are quickly and inexpensively constructed. A socket consists of a flat metal plate mounting the mating connectors for one or more cables and up to six bus connectors as associated wiring;
- an integral adjustable hook/support device (not shown) on the front of each cabinet supports the weight of heavy cables facilitating their connection.

The bus panel consists of sets of six lockable connectors which carry the connection points to the controller. The three connectors at the front of the cabinet carry the 130 Group A or source points and the rear three connectors the 130 sink points. These connectors mate with connectors on the rear of each fixture panel which are wired into the mating cable connectors. There are eight complete sets of connectors for mating into fixture panels, although in practice more than eight may be accommodated. The ninth row of connectors provide for interconnection of one cabinet with the next or with the controller in a daisy chained fashion.

The six vertical columns of connectors are bussed by means of ribbon cable sandwiched between the bus panel and the outer cabinet wall.

By way of further clarification, FIG. 11 shows the interface circuitry to the computer buss, i.e., that circuitry which is on a conventional circuit board which can be "plugged into" the computer's internal buss.

Figure 13A:
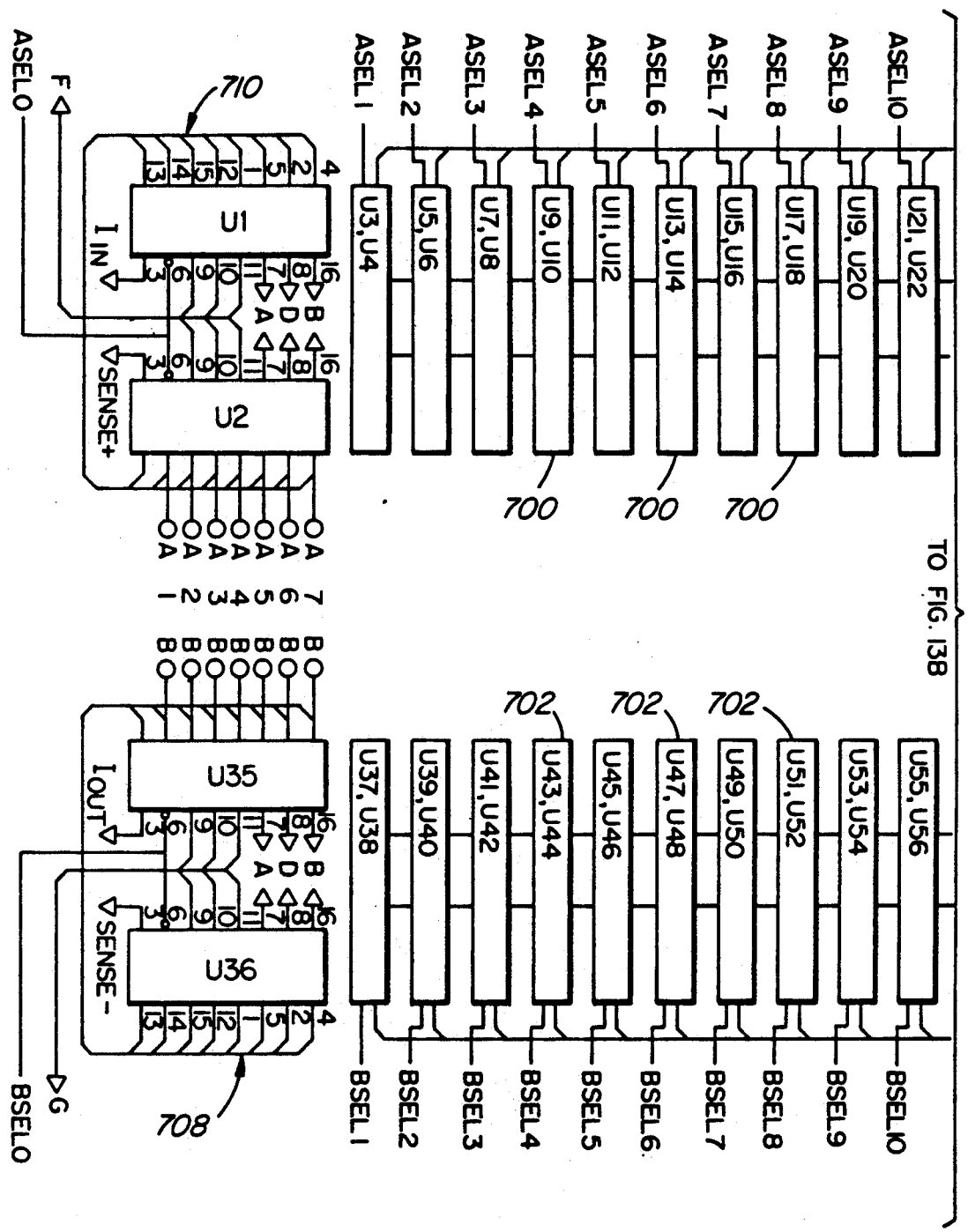
FIGS. 13A and 13B are schematic drawings showing detail of the pairs of switches used in the control circuit of this invention.
Figure 13B:
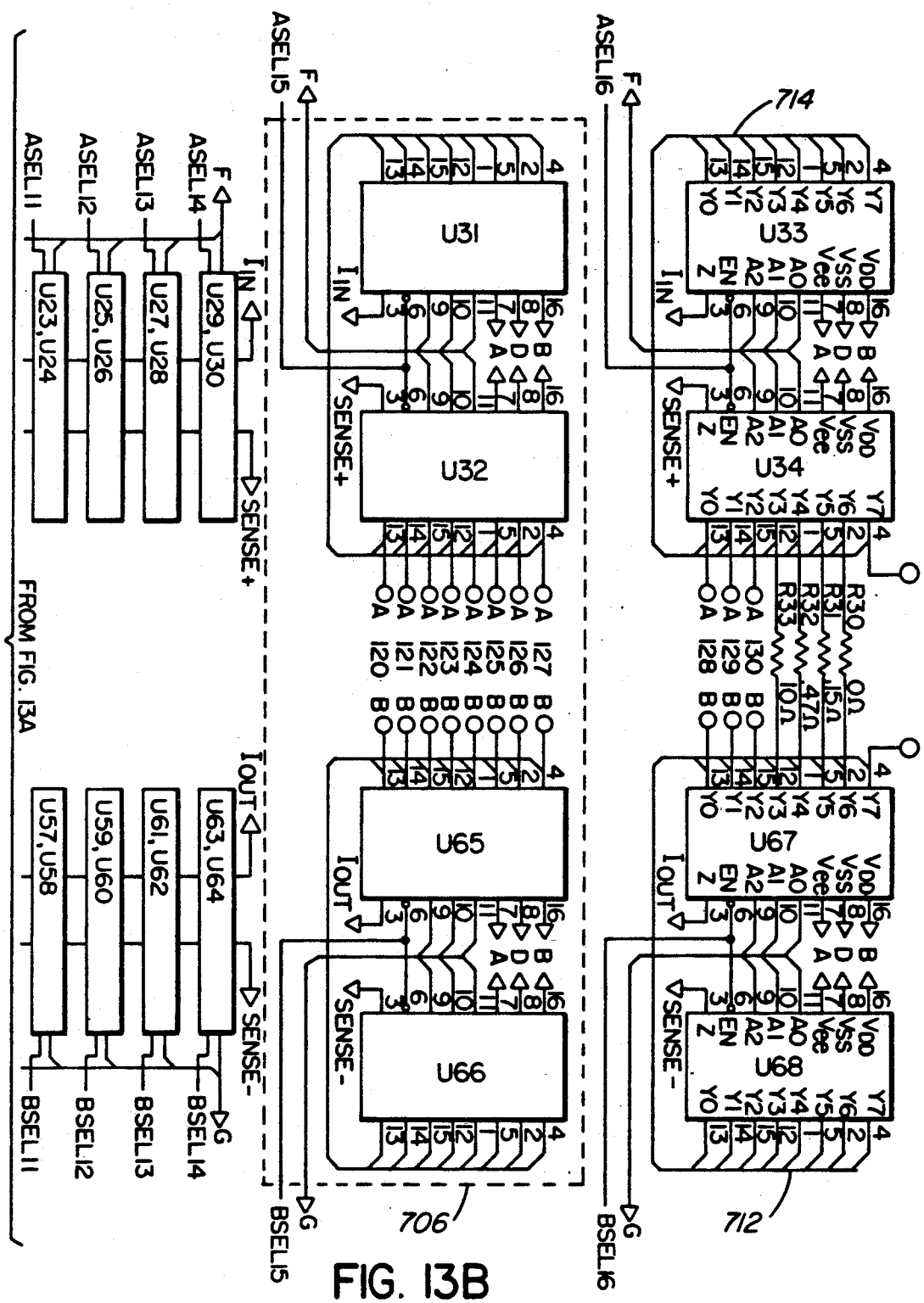

Similarly, FIG. 12 sets out a greater detail the circuitry which accomplishes the addressing and measurement functions in the operation of the control circuit 130 (in FIG. 2) of this invention. In FIG. 13A and 13B there is shown schematically, details of the first, second, third and fourth groups of switches noted in the description of FIG. 2. There are seventeen groups of switches shown in FIG. 13. The details for each of the "upper" and "lower" series of switches shown overall by the rectangular boxes at 700 and 702 in FIG. 13A, are the same in detail as the pair of switches shown within the box in dotted lines in FIG. 13B, and marked 706. Pairs of switches 708 and 710, and 712 and 714, are at address numbers BSEL0 and BSEL16, at the left and right portions of FIGS. 13A and B respectively. The pairs of switches 708 and 710, and 712 and 714 are configured differently from the pairs of switches 700 and 702. This occurs because the former pairs of switches are used for internal calibration of the control circuit 130 of FIG. 2.

It will be realized with reference to FIGS. 9 and 10, that connections such as those shown at 604(A) and 604(b) and 700 and 702 are provided in complementary pairs, associated for example, with the conducting of an outgoing signal from the computer, and the resulting incoming signal generated by the condition of the conductor/cable under test.

The Cable Tester disclosed herein is described for testing cables, however any other systems such as printed circuit boards may be tested for continuity or short circuit by providing a corresponding socket on the cable tester and providing the address of the connection pins of that socket to the computer.

Although the invention has been described with reference to preferred embodiments of the invention thereof it will be understood by those skilled in the art that various changes in form and details may be made therein without departing from the spirit and scope of the invention.

What is claimed is:

1. A control circuit for a cable tester having a computer interface and a cable adaptor comprising:
   a current source having inputs from said computer interface and outputs to a first group of solid state switches;
   said first group of solid state switches having inputs from said current source and the computer interface and having outputs to an input of the cable adapter;
   a second group of solid state switches having inputs from said first group of solid state switches and said computer interface and having outputs to a first amplifier means;
   a third group of solid state switches having inputs from a fourth group of solid state switches and the computer interface and having outputs to said first amplifier means;
   said fourth group of switches having inputs from an output of the cable adapter and the computer interface and having an output to ground; and
   said first amplifier means having an output to said computer interface;
   whereby
   when a cable, having at least a conductor therein, is connected to the cable adaptor the computer interface is operative to selectively activate the current source and close each of the related switches in the first, second, third and fourth groups of solid state switches thereby causing a current to flow through a selected conductor in the cable under test and hence providing the computer interface with an output from said first amplifier means.

2. The control circuit of claim 1 where said first, second, third and fourth solid state switches are of the CMOS JFET type.

3. The control circuit of claim 1 where said current source comprises: a transistor having its collector connected to a voltage source through a resistor; and an operational amplifier having inputs from a voltage source through a resistor, an input from the emitter of the transistor and an output to the base of the transistor.

4. The control circuit of claim 3 where said first amplifier means comprises: a first, second, third and fourth resistor; and a differential amplifier having a first input from the output of said second group of solid state switches through said first resistor, a second input from the output of said third group of solid state switches through said second resistor, a first feedback at said first input through said third resistor, and a second feedback at said second input through said fourth resistor.

5. The control circuit of claim 1 further comprising:
   a voltage source having an input from the computer interface and having an output to said first group of solid state switches; and
   a second amplifier means having an input from said fourth group of solid state switches and having an output to the computer interface;
   whereby
   when a cable having at least a conductor therein is connected to the cable adaptor the computer interface is operative to selectively activate the voltage source and close each of the related switches in the first, second, third and fourth groups of solid state switches thereby providing the computer interface with an output from said second amplifier means.

6. The control circuit of claim 5 where said first, second, third and fourth solid state switches are of the CMOS JFET type.

7. The control circuit of claim 5 where said current source comprises: a transistor having its collector connected to a voltage source through a resistor; and an operational amplifier having inputs from a voltage source through a resistor, an input from the emitter of the transistor and an output to the base of the transistor.

8. The control circuit of claim 5 where said second amplifier means comprises: a first, second, and third resistor; and an operational amplifier having a first input from ground through said first resistor, a second input from said fourth group of solid state switches through a second resistor, a feedback to said first input through a third resistor and an output to said computer interface.

9. The control circuit of claim 1 where said first amplifier means comprises: a first, second, third and fourth resistor; and a differential amplifier having a first input from said second group of solid state switches through said first resistor, and a second input from said third group of solid state switches through said second resistor, a first feedback at said first input through said third resistor, and a second feedback at said second input through said fourth resistor.

10. A cable tester comprising a computer interconnected with a computer interface interconnected with a control circuit interconnected with a cable adaptor where said control circuit further comprises:
- a current source having inputs from said computer interface and outputs to a first group of solid state switches;
- said first group of solid state switches having inputs from said current source and the computer interface and having outputs to an input of the cable adapter;
- a second group of solid state switches having inputs from said first group of solid state switches and said computer interface and having outputs to a first amplifier means;
- a third group of solid state switches having inputs from a fourth group of solid state switches and the computer interface and having outputs to said first amplifier means; and
- said fourth group of switches having inputs from an output of the cable adapter and the computer interface and having an output to ground; and
- said first amplifier means having an output to said computer interface;

whereby
- when a cable, having at least a conductor therein is connected to the cable adaptor, the computer interface is operative to selectively activate the current source and close each of the related switches in the first, second, third and fourth groups of solid state switches thereby causing a current to flow through a selected conductor in the cable under test and hence providing the computer interface with an output from said first amplifier means.

11. The cable tester of claim 10 where said first, second, third and fourth solid state switches are of the CMOS JFET type.

12. The cable tester of claim 10 where said current source comprises: a transistor having its collector connected to a voltage source through a resistor; and an operational amplifier having inputs from a voltage source through a resistor, an input from the emitter of the transistor and an output to the base of the transistor.

13. The cable tester of claim 10 where said first amplifier means comprises: a first, second, third and fourth resistor; and a differential amplifier having a first input from the output of said second group of solid state switches through said first resistor, a second input from the output of said third group of solid state switches through said second resistor, a first feedback at said first input through said third resistor, and a second feedback at said second input through said fourth resistor.

14. The cable tester of claim 10 further comprising:
- a voltage source having an input from the computer interface and an output to said first group of solid state switches; and
- a second amplifier means having an input from said fourth group of solid state switches and an output to the computer interface;

whereby
- when a cable having at least a conductor therein is connected to the cable adaptor the computer interface is operative to selectively activates the voltage source and close each of the related switches in the first, second, third and fourth groups of solid state switches thereby providing the computer interface with an output from said second amplifier means.

15. The cable tester of claim 14 where said current source comprises: a transistor having its collector connected to a voltage source through a resistor; and an operational amplifier having inputs from a voltage source through a resistor, an input from the emitter of the transistor and an output to the base of the transistor.

16. The cable tester of claim 14 where said first amplifier means comprises: a first, second, third and fourth resistor; and a differential amplifier having a first input from said second group of solid state switches through said first resistor, a second input from said third group of solid state switches through said second resistor, a first feedback at said first input through said third resistor, and a second feedback at the second input through said fourth resistor.

17. The cable tester of claim 14 where said second amplifier means comprises: a first, second, and third resistor; and an operational amplifier having a first input from ground through said first resistor, a second input from said fourth group of solid state switches through a second resistor, a feedback to said first input through a third resistor, and an output to said computer interface.

18. A cable adaptor for the cable tester of claim 14 comprising:
- a plurality of fixtures to which cables to be tested can be connected; and:
- a busing system for connecting said fixtures to said control circuit.

19. The cable tester of claim 10 where said cable adaptor is comprised of a plurality of different types of fixtures for connecting a plurality of cables to the cable adaptor.

20. The cable tester of claim 10 where said cable adaptor has the capability of being adaptable to a printed circuit board.

* * * * *